(12) United States Patent
Gilgrass

(10) Patent No.: US 7,616,083 B2
(45) Date of Patent: Nov. 10, 2009

(54) RESIN-IMPREGNATED SUPERCONDUCTING MAGNET COIL COMPRISING A COOLING LAYER

(75) Inventor: Graham Gilgrass, Wallingford (GB)

(73) Assignee: Siemens Magnet Technology Ltd., Witney (GB)

( * ) Notice: Subject to any disclaimer, the term of this patent is extended or adjusted under 35 U.S.C. 154(b) by 189 days.

(21) Appl. No.: 11/598,007

(22) Filed: Nov. 13, 2006

(65) Prior Publication Data

US 2007/0257754 A1 Nov. 8, 2007

(30) Foreign Application Priority Data

Nov. 14, 2005 (GB) .................. 0523149.3
Feb. 13, 2006 (GB) .................. 0602797.3

(51) Int. Cl.
H01F 7/00 (2006.01)
H01F 1/00 (2006.01)
H01F 6/00 (2006.01)

(52) U.S. Cl. ...................... 335/216; 335/300

(58) Field of Classification Search ............... 335/216, 335/300
See application file for complete search history.

(56) References Cited

U.S. PATENT DOCUMENTS

| 3,416,111 A | | 12/1968 | Bogner | |
| 3,946,348 A | * | 3/1976 | Schleich | ............... 335/216 |
| 4,640,005 A | * | 2/1987 | Mine et al. | ............... 29/599 |
| 4,808,954 A | * | 2/1989 | Ito | ............... 335/216 |
| 4,935,714 A | * | 6/1990 | Vermilyea | ............... 505/211 |
| 5,404,122 A | * | 4/1995 | Maeda et al. | ............... 335/216 |
| 5,530,413 A | * | 6/1996 | Minas et al. | ............... 335/216 |
| 5,532,663 A | * | 7/1996 | Herd et al. | ............... 335/216 |
| 5,774,032 A | * | 6/1998 | Herd et al. | ............... 335/216 |
| 2006/0077025 A1 | * | 4/2006 | Funaki et al. | ............... 335/216 |
| 2007/0120630 A1 | * | 5/2007 | Huang et al. | ............... 335/216 |

FOREIGN PATENT DOCUMENTS

| EP | 0 413 571 A1 | 8/1990 |
| EP | 0 825 706 B1 | 11/2003 |
| GB | 1 443 780 A | 7/1976 |
| GB | 2 426 630 A | 11/2006 |
| JP | S61-271804 | 5/1985 |
| JP | 62-13010 A | 1/1987 |
| JP | 6-174349 | 6/1994 |
| JP | 10-189328 | 7/1998 |
| WO | WO 03/069687 A1 | 8/2003 |

OTHER PUBLICATIONS

Great Britain Search Reports dated Feb. 14, 2007 and Mar. 9, 2007 (four (4) pages).

* cited by examiner

*Primary Examiner*—Elvin G Enad
*Assistant Examiner*—Mohamad A Musleh
(74) *Attorney, Agent, or Firm*—Crowell & Moring LLP

(57) ABSTRACT

A resin-impregnated superconducting magnet coil comprising a number of turns of superconducting wire (14) embedded within a resin (16) having an outer filler layer (18) composed of the resin, filled with filler material (20). The coil further comprises a cooling layer (22) interposed between the superconducting wire (14) and the filler layer (18).

19 Claims, 2 Drawing Sheets

RESIN-IMPREGNATED SUPERCONDUCTING MAGNET COIL COMPRISING A COOLING LAYER

BACKGROUND AND SUMMARY OF THE INVENTION

The present invention relates to the coils of a superconducting magnet, and in particular to the provision of cooling means for superconducting coils which are not immersed in a bath of cryogen fluid.

Superconducting magnets typically include a number of superconducting coils within a bath of liquid cryogen. More recently, 'dry' cryostats have become available, wherein alternative methods of cooling the coils are used. This may involve refrigeration of the coils by conduction through a thermally conductive path to a refrigerator, or may involve a cooling loop. A cooling loop is typically a thermally conductive tube carrying a small quantity of liquid cryogen. Heat from cooled equipment is absorbed through the wall of the thermally conductive tube into the liquid cryogen. The cryogen may expand, or boil, setting up convection currents in the liquid cryogen of the cooling loop. These convection currents cause the cryogen to circulate around the cooling loop to a refrigerator, which re-cools the cryogen. In this way, cooling power is distributed around the equipment.

Japanese patent application JP61-271804 describes a superconducting electromagnet having coils wound onto a former. A heat-conducting material is placed between the coil and the former and/or over the outer surface of the coil. A heat-conducting support plate, a feature of conventional on-former coil winding, is connected to the heat conducting material, and the support plate is cooled by liquid helium circulation through a cooling pipe.

The arrangement provided by this prior art has, however, been found to be undesirable for at least the following reasons. The prior art of JP61-271804 relies upon the coils being wound onto a former, which retains the coils in use. The coils are thus retained on their inner dimension. It is preferred that no former be provided, such that the coils themselves may be reduced in diameter, or that the usable bore of the coil should be increased. It is accordingly desired that the coil should be supported on its outer diameter, although this may create difficulties in accurately aligning the coil. It is also desired that the coil should have the highest possible current density, that is, the greatest possible proportion of the coil's cross-sectional area should be occupied by conductor. This assists in reducing the overall dimensions of the coil, and hence the magnet. It may also assist in reducing the total amount of superconducting wire required, and so also in reducing the cost of the coil. Attention must also be paid to the control of hoop stress within the coil, and to the possibility of damaging eddy currents flowing in system components.

GB 1443780 A describes a resin impregnated coil with axial cooling ducts and braiding between layers of the coil separated by fibres coated in thermally conductive material. In adopting this approach the coil current density is diminished, therefore a larger coil would be required to maintain ampere turns for field generation.

EP 0 413 571 A1 describes free standing epoxy coils for a refrigerated (conduction cooled) MRI magnet that are located by spacers and end sleeves (making up the cartridge) in such a way as to be demountable. Copper foil loops and overwrap are provided within and on an outer surface of the coils. This provides mechanical strengthening, but appears to have no cooling function.

JP 6176349 addresses the clamping of a coil by two plates between axial faces for direct cooling, while JP 10189328 describes a similar thermally conductive coil thrust face for direct cooling.

It has become convention, in both conduction cooling and cooling loop arrangements, to cool coils through a thermally conductive former. The former may locate the coils on either their inner or outer diameter. Location of the coils on their outer diameters results in a reduced inner coil diameter, resulting in reduced requirement for superconducting wire, and a smaller, less expensive and bulky system. It is also enables the coil itself be located as close to the patient bore as possible, for the same reasons.

In solenoidal magnets constructed with an external former, the coils of superconducting wire themselves are impregnated with resin, to form a solid coil structure. These coils are retained on their outer and side surfaces to provide the desired solenoidal arrangement of coils. In order to achieve the correct radius of each coil, yet allow mounting of all coils to a common external former, it has been found necessary to provide a filler layer, to fill a gap between the nominal outer radius of the coil and the surface of the external former. This filler layer typically comprises the same impregnation resin as used in the coil, filled with a filler material, such as glass fibre or glass beads. The ratio of resin to filler material is selected so that the thermal contraction rate of the resulting material matches the thermal contraction rate of the impregnated coil as closely as possible.

In operation, the magnetic field generated by the solenoidal magnet will act to push each coil in one direction or the other. Typically, the external former is arranged such that a solid step is provided to prevent the coil from moving in the direction it is being pushed. The other side of the coil typically has a clamping arrangement to hold the coil in position against the step in the former.

The coils in typical dry cryostats are cooled by thermal conduction along the material in contact with or bonded to the coil, such as the external former, to a cooling means such as a cooling loop or a refrigerator. When the coils are provided with a filler layer, the cooling of the coil by thermal conduction through the external former becomes difficult. In order to extract heat from the coil through the former, the heat will need to flow through the filler layer. However, the filler layer is typically composed of materials of low thermal conductivity, such as resin and glass. The cooling of the superconducting coils is thus impeded by the presence of the filler layer.

The present invention aims to alleviate the problems of the prior art and provide equipment for effective cooling of coils having a filler layer on their outer surface, mounted on an external former.

BRIEF DESCRIPTION OF THE DRAWING FIGURES

The above, and further objects, characteristics and advantages of the present invention will become more apparent from consideration of the following description of certain embodiments, given by way of examples only, in conjunction with the following drawings, wherein.

DETAILED DESCRIPTION OF THE DRAWING FIGURES

Figure 1:
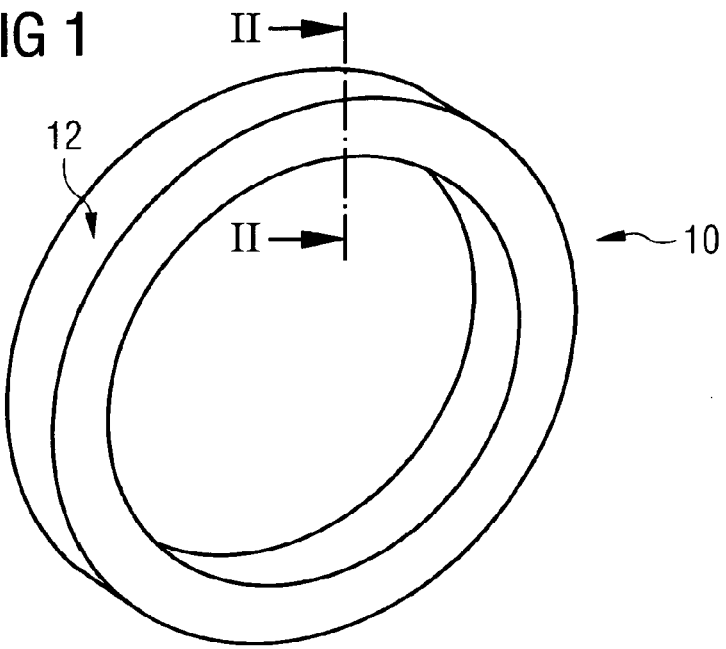
FIG. 1 shows a general view of an impregnated superconducting coil.

FIG. 1 shows a general representation of an impregnated magnet coil 10. The coil is a single solid piece of resin, with many turns of superconducting wire embedded inside. As described above, the outer surface 12 carries a filler layer composed of a resin filled with a filler material such as glass fibre or glass beads.

Figure 2:
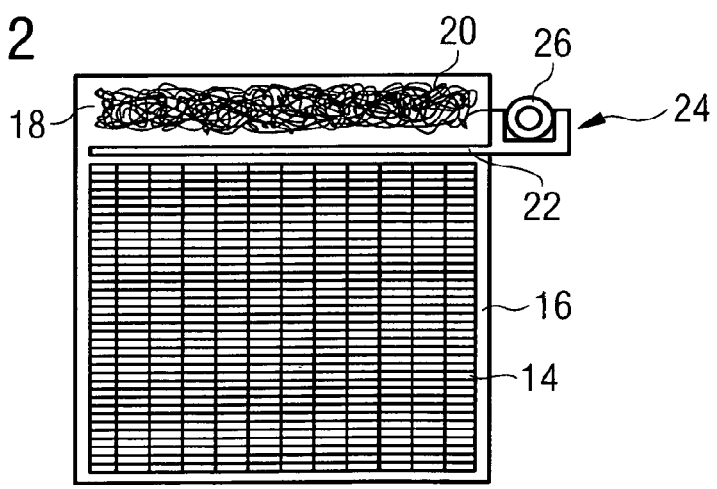
FIG. 2 shows a cross-sectional view of a coil, similar to that shown in FIG. 1, modified according to the present invention.

FIG. 2 shows a partial cross-section through a coil, such as that shown at II in FIG. 1, modified according to the present invention. As illustrated in FIG. 2, the coil comprises a number of turns of superconducting wire 14, embedded within a resin 16. Typically, the resin provides electrical insulation between adjacent turns of the coil in addition to structural integrity. An upper filler layer 18 is composed of the resin, filled with filler material 20 such as glass fibre or glass beads.

According to an aspect of the invention, a cooling layer 22 is provided, interposed between the superconducting wire 14 and the filler layer 18. The cooling layer is electrically isolated from the superconducting wire 14, for example by a layer of the resin, compatible insulating material or an anodised surface if aluminium is used for the cooling layer. The cooling layer 22 is a material of relatively high thermal conductivity—much higher than the thermal conductivity of the resin 16 or the material of the filler layer 18. A block part 24 is provided, attached to one side of the cooling layer. This block part is preferably integral with the cooling layer interposed between the superconducting wire 14 and the filler layer 18, but is at least in good thermal contact with the cooling layer interposed between the superconducting wire 14 and the filler layer 18. The block part 24 is arranged to be cooled. In the embodiment shown in FIG. 2, the block part is shaped to receive a cooling tube 26 of a cooling loop refrigeration arrangement as described above. In a typical embodiment, the cooling layer 22 and block part 24 will be a single aluminium extrusion, shaped to receive a cooling tube 26 in an interference fit in a channel formed in the block part. A particularly preferred material for the cooling layer and block is anodised pure aluminium. Optionally, one or both side walls of the channel may be deformed towards the cooling tube, to provide a more secure retention of the cooling tube.

In operation, heat will be generated within the cryostat and coil structure due to induced eddy currents. These are produced by pulsing gradient coils within the magnet bore which results in time varying magnetic flux in the electrically conducting surfaces surrounding the gradient coils. The coil structure will also absorb thermal energy which has penetrated the system from the exterior, via radiation or conduction. The cooling tube 26 will act, as described above, to cool the block part 24 and the cooling layer 22. Heat will be conducted from the superconducting wire 14 to the cooling layer, then to the block part 24 and to the cooling loop. Heat is thereby effectively removed from the coil without the need for it to flow through the filler layer 18.

Figure 3:
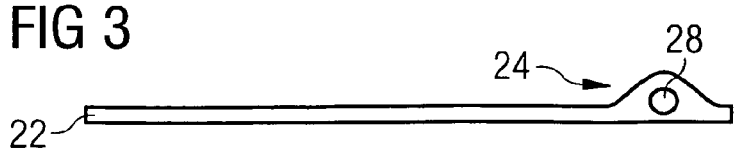
FIGS. 3-4 show features of alternative embodiments of the present invention.

FIG. 3 shows a cooling layer according to an alternative embodiment of the invention. The cooling layer is again formed as a single extrusion, preferably of aluminium. In this case, the block part 24 is formed with its own integral channel 28 which may be used as a cooling loop tube. This embodiment has certain advantages over the embodiment of FIG. 2, for example in that the assembly step of incorporating the cooling loop 26 within the block part 24 does not need to be performed, and there is no potential for thermal resistance in the interface between the cooling loop 26 and the block part 24.

Figure 4:
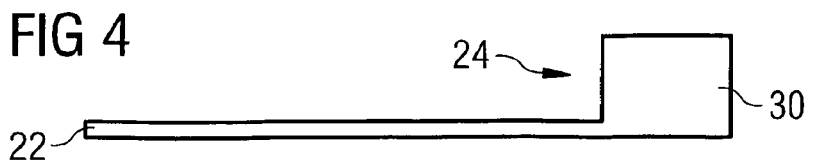

A further alternative embodiment of the cooling layer is illustrated in FIG. 4. The cooling layer is again formed as a single extrusion, preferably of aluminium. In this case, the block part 24 is formed as a solid piece 30, so as to have a minimum thermal resistance along its length. This embodiment is particularly suitable for direct conduction cooling. A refrigerator is arranged in thermal contact with the block part of the cooling layer. Heat is removed from the block part by the refrigerator, which in turn cools the cooling layer 22 to cool the superconducting wire 14 without requiring heat to travel across the filler layer 18.

While the cooling layer of the present invention should be provided around a sufficient extent of the coil to provide effective cooling, the cooling layer need not be provided around the entire circumference of the coil. Indeed, an incomplete cooling layer may be preferred in order to reduce electrical eddy currents in the cooling layer.

While the block 24 and any associated cooling tube 26 are illustrated in the drawings as located outside of the body of the coil, some embodiments of the invention may have the block part 24 and any associated cooling tube 26 partially or fully embedded within the material of the coil itself, embedded within the resin 16.

Figure 5:
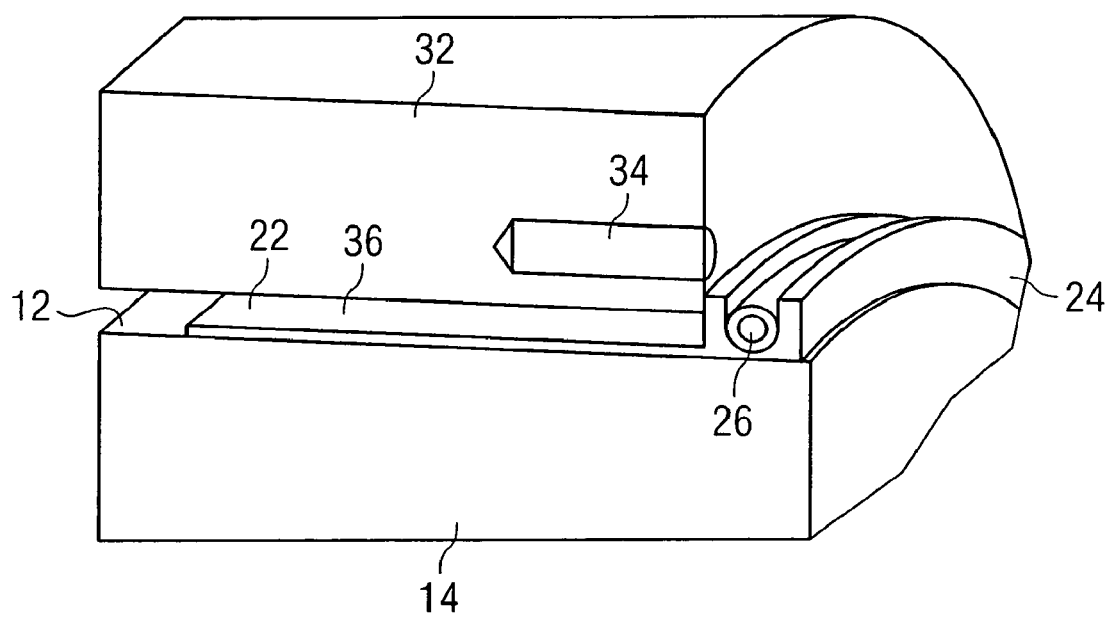
FIG. 5 shows a mould used for manufacturing coils having a cooling layer according to the present invention.

A method for manufacturing coils having a cooling layer according to the present invention will now be described with reference to FIG. 5. The coil of superconducting wire 14 is wound into a mould which will retain the impregnating resin during the impregnation step. Only a part 32 of the mould is illustrated in FIG. 5. However, it will be understood that the mould, in use, comprises sufficient components to restrain the turns 14 of superconducting wire in position, and to form a substantially closed chamber within which resin impregnation may take place. As illustrated, mould piece 32 may include fitting means such as tapped hole 34 for the mounting of further mould pieces. The mould may be built up as the method progresses, initially comprising only those parts necessary to retain turns 14 of superconducting wire in place, later being added to to form a complete chamber for resin impregnation. The cooling layer 22, which in the illustrated embodiment carries cooling tube 26 in block part 24, is then applied over the superconducting wire, along part or the entire circumference of the coil.

If the cooling layer is of an electrically conductive material, care must be taken to electrically isolate it from the superconducting wire 14. This may be by coating the cooling layer 22, for example by anodising an aluminium cooling layer, or applying another electrically isolating layer, or providing a layer of resin between the superconducting wire 14 and the cooling layer 22.

A filler layer is then formed within a cavity 36, present on a radially outer surface of the cooling layer 22, within the chamber for resin impregnation, by wrapping filler material 20, such as glass fibre matting or glass fibre wool, over the cooling layer 22. The whole resulting structure is then impregnated with resin 16 within the mould to form the final structure.

In preferred embodiments, the surface of the cooling layer is roughened (e.g. by anodising an aluminium cooling layer) to promote adhesion of the resin and/or perforated, to facilitate passage of resin through the entire structure during resin impregnation, and to ensure secure retention of the cooling layer within the coil.

According to the present invention, therefore, a cooled coil is provided which has a minimum inner diameter of the superconducting wire turns themselves, since no former or thermally conductive layer or similar is required radially inward of the wire turns. A filler layer is provided on the radially outer surface of the coil, which enables accurate sizing and robust mechanical mounting of the coil. The coil is accordingly moulded to size for support on its external diameter. By locating the cooling layer between the wire turns and the filler layer, a minimum length of superconducting wire is required, and a maximum current density of the coil is achieved, while effective cooling of the turns is provided. No thick, insulating layer is required between the cooling layer and the turns, so cooling is effective.

The particular types of cooling layer contemplated avoid the need for a separate support plate, a conventional feature of on-former winding, or the need for in-situ brazing or welding of such a support plate to a thermally conductive cooling layer.

As can be seen in FIG. 5, the position of the cooling layer 22 is preferably defined by various components of the mould. This in turn allows the coil itself to be accurately positioned within the mould, being retained in position by the cooling layer.

The mechanical properties of the cooling layer, such as its tensile strength, may also serve in control of hoop stress in the magnet when in use. The electrical properties of the cooling layer, which may typically be electrically conductive, may assist in quench protection.

The present invention is believed to provide the most economic distribution of conductor for this type of solenoid design whist utilising an insulated thermally conducting loop to cool the coil. If anodised aluminium is used, providing good resin adhesive bond strength and electrical insulation properties, it can be placed very close to the surface of the coil. The conductive layer is preferably split, not forming an electrically continuous hoop, to reduce eddy currents circulating in it.

While the present invention has been described with reference to a limited number of particular embodiments, various modifications and variations of the present invention will be apparent to those skilled in the art.

The invention claimed is:

1. A resin-impregnated superconducting magnet coil comprising a number of turns of superconducting wire embedded within a resin having an outer filler layer composed of the resin, filled with filler material characterized in that the coil further comprises a cooling layer interposed between an outer surface of the superconducting wire turns and the filler layer, the cooling layer comprising a layer of a material of greater thermal conductivity than the thermal conductivity of the resin or the material of the filler layer and a block part in thermal contact with a portion of the cooling layer that is interposed between an outer surface of the superconducting wire and the filler layer, the block part being arranged for cooling to below the critical temperature of the superconducting wire, wherein the cooling layer is of anodized aluminum, add and wherein the block part is arranged outside of the portion of the cooling layer that is interposed between the outer surface of the superconducting wire and the filler layer.

2. A resin-impregnated superconducting magnet coil according to claim 1, wherein the block part is shaped to receive a cooling tube of a cooling loop refrigeration arrangement.

3. A resin-impregnated superconducting magnet coil according to claim 2, wherein the cooling layer and the block part are a single extrusion, shaped to receive a cooling tube in an interference fit in a channel formed in the block part.

4. A resin-impregnated superconducting magnet coil according to claim 1, wherein the cooling layer and block part are a single extrusion, the block part containing an integral channel for use as a cooling loop tube.

5. A resin-impregnated superconducting magnet coil according to claim 1, wherein the cooling layer and block part are a single extrusion, the block part being a solid piece.

6. A resin-impregnated superconducting magnet coil according to claim 1, wherein the block part and any associated cooling tube is at least embedded within the resin.

7. A resin-impregnated superconducting magnet coil according to claim 1, wherein the cooling layer is perforated.

8. A solenoidal magnet structure comprising a resin-impregnated superconducting magnet coil according to claim 1.

9. A magnetic resonance imaging (MRI) or nuclear magnetic resonance (NMR) system comprising a solenoidal magnet structure according to claim 8.

10. A method for manufacturing coils having a cooling layer comprising the steps of:
    winding superconducting wire into a mould;
    applying a cooling layer over the superconducting wire, along at least part of the circumference of the coil;
    applying a filler layer over the cooling layer by wrapping filler material over the cooling layer;
    impregnating the whole resulting structure with resin, within the mould to form the final structure wherein a portion of the cooling layer is interposed between an outer surface of the superconducting wire and the filler layer, and the cooling layer includes a block part that is arranged outside of the portion of the cooling layer that is interposed between the superconducting wire and the filler layer.

11. A method according to claim 10, wherein the position of the cooling layer is defined by various components of the mould, allowing the coil itself to be accurately positioned within the mould, being retained in position by the cooling layer.

12. A method according to claim 10, wherein the step of applying a filler layer is achieved by winding glass fiber matting or glass fiber wool.

13. A method according to claim 10, wherein the cooling layer is of an electrically conductive material and is electrically isolated from the superconducting wire.

14. A method according to claim 10, wherein the surface of the cooling layer is roughened to promote adhesion of the resin.

15. A method according to claim 10, wherein the cooling layer is perforated, to facilitate passage of resin through the entire structure during resin impregnation, and to ensure secure retention of the cooling layer to the coil.

16. A method according to claim 13, wherein the cooling layer comprises anodized aluminum, and wherein the anodized surface provides electrical insulation and/or adhesion promoting surface texture.

17. A resin-impregnated superconducting magnet coil comprising:
- a number of turns of superconducting wire embedded within a resin, the resin having an outer filler layer filled with filler material; and
- a cooling layer, a portion of which is interposed between an outer surface of the superconducting wire turns and the filler layer,
- wherein the cooling layer includes a block part that is arranged outside of the area of the cooling layer that is interposed between the superconducting wire turns and the filler layer,
- wherein the cooling layer comprises a layer of a material of greater thermal conductivity than the thermal conductivity of the resin or the material of the filler layer and a block part in thermal contact with the cooling layer.

18. The resin-impregnated superconducting magnet coil of claim 17, wherein the block part is a solid piece of material.

19. The resin-impregnated superconducting magnet coil of claim 17, wherein the block part includes an opening accommodating a cooling tube.

* * * * *

UNITED STATES PATENT AND TRADEMARK OFFICE
CERTIFICATE OF CORRECTION

| | | |
|---|---|---|
| PATENT NO. | : 7,616,083 B2 | Page 1 of 1 |
| APPLICATION NO. | : 11/598007 | |
| DATED | : November 10, 2009 | |
| INVENTOR(S) | : Graham Gilgrass | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 183 days.

Signed and Sealed this

Fourteenth Day of December, 2010

David J. Kappos
*Director of the United States Patent and Trademark Office*